(12) United States Patent
Evans et al.

(10) Patent No.: US 7,176,470 B1
(45) Date of Patent: Feb. 13, 2007

(54) TECHNIQUE FOR HIGH-EFFICIENCY ION IMPLANTATION

(75) Inventors: Morgan D. Evans, Manchester, MA (US); Douglas Thomas Fielder, Peabody, MA (US); Gregg Alexander Norris, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 11/313,714

(22) Filed: Dec. 22, 2005

(51) Int. Cl.
*H01J 21/265* (2006.01)
(52) U.S. Cl. ............... 250/492.21; 250/442.11; 250/398; 250/396; 315/506
(58) Field of Classification Search .......... None
See application file for complete search history.

(56) References Cited

U.S. PATENT DOCUMENTS

| | | |
|---|---|---|
| 4,260,897 A | 4/1981 | Bakker et al. |
| 4,421,988 A | 12/1983 | Robertson et al. |
| 4,736,107 A | 4/1988 | Myron |
| 4,922,106 A | 5/1990 | Berrian et al. |
| 4,980,562 A | 12/1990 | Berrian et al. |
| 6,580,083 B2 | 6/2003 | Berrian |
| 6,614,027 B1 | 9/2003 | Iwasawa |
| 6,645,230 B2 | 11/2003 | Whitehurst |
| 6,690,022 B2 | 2/2004 | Larsen et al. |
| 6,870,170 B1 | 3/2005 | Farley et al. |
| 6,903,350 B1 | 6/2005 | Vanderberg et al. |
| 7,109,499 B2 * | 9/2006 | Angel et al. ........... 250/492.21 |
| 2002/0003215 A1 | 1/2002 | Berrian |

* cited by examiner

*Primary Examiner*—Nikita Wells
*Assistant Examiner*—Zia R. Hashmi
(74) *Attorney, Agent, or Firm*—Hunton & Williams LLP

(57) ABSTRACT

A technique for high-efficiency ion implantation is disclosed. In one particular exemplary embodiment, the technique may be realized as an apparatus for high-efficiency ion implantation. The apparatus may comprise one or more measurement devices to determine a shape of an ion beam spot in a first dimension and a second dimension. The apparatus may also comprise a control module to control movement of the ion beam across a substrate according to a two-dimensional velocity profile, wherein the two-dimensional velocity profile is determined based at least in part on the shape of the ion beam spot, and wherein the two-dimensional velocity profile is tunable to maintain a uniform ion dose and to keep the ion beam spot from going fully off the substrate surface.

15 Claims, 11 Drawing Sheets

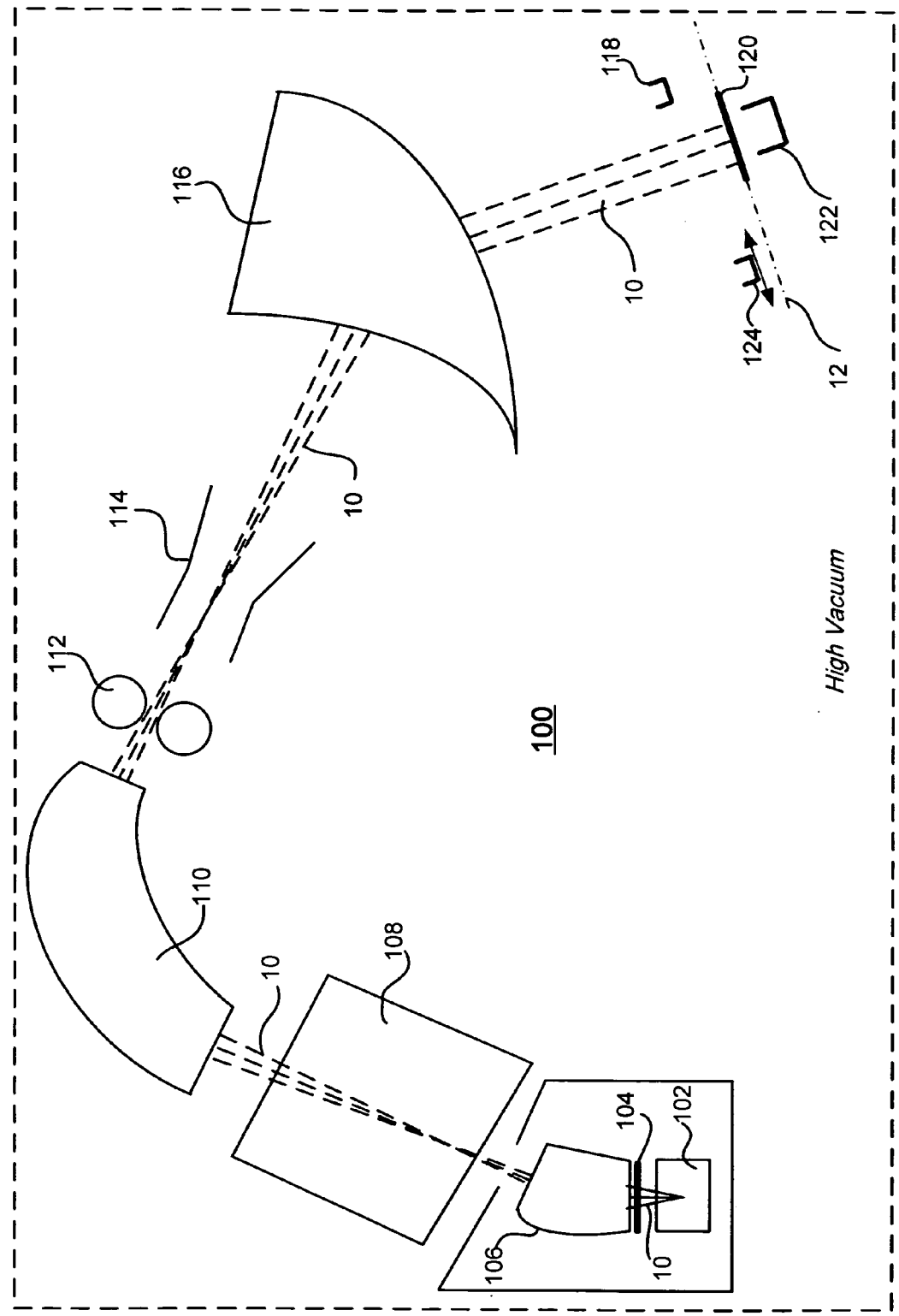

TECHNIQUE FOR HIGH-EFFICIENCY ION IMPLANTATION

FIELD OF THE DISCLOSURE

The present disclosure relates generally to semiconductor manufacturing and, more particularly, to a technique for high-efficiency ion implantation.

BACKGROUND OF THE DISCLOSURE

Ion implantation is a process of depositing chemical species into a substrate by direct bombardment of the substrate with high-energy ions. In semiconductor fabrication, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels. A specification of the ion species, doses and energies is referred to as an ion implantation recipe.

FIG. 1 depicts a prior art ion implanter system 100. As is typical for most ion implanter systems, the system 100 is housed in a high-vacuum environment. The ion implanter system 100 may comprise an ion source 102 and a complex series of components through which an ion beam 10 passes. The series of components may include, for example, an extraction manipulator 104, a filter magnet 106, an acceleration or deceleration column 108, an analyzer magnet 110, a rotating mass slit 112, a scanner 114, and a corrector magnet 116. Much like a series of optical lenses that manipulate a light beam, the ion implanter components can filter and focus the ion beam 10 before steering it towards a target wafer 120 (located in a wafer plane 12). A number of measurement devices, such as a dose control Faraday cup 118, a traveling Faraday cup 124, and a setup Faraday cup 122, may be used to monitor and control the ion beam conditions.

In the design and operation of an ion implanter, ion dose uniformity and ion beam utilization are two major concerns since they directly impact the productivity of the ion implanter.

To achieve a uniform distribution of dopants, an ion beam is typically moved across the surface of the target wafer during an implantation process. FIG. 2A shows a typical setup for continuous implantation with an ion beam. In an ion implanter system, an ion beam spot 202 may be swept horizontally (i.e., in the X direction) across the surface of a wafer 204. A dose control Faraday cup 206 may be used to measure the ion beam current. At the same time, the wafer 204 may be translated vertically along a path 212 (i.e., in the Y direction) through a process chamber. Thus, the ion beam spot 202 is scanned with respect to the wafer 204 in both the X and Y directions. The net effect of the movement of the ion beam spot 202 in the X and Y directions is a beam path 20, as shown in FIG. 2B, that zigzags across the entire surface of the wafer 204 as well as its surrounding area. Since the ion beam spot 202 moves completely off the wafer 204 in each sweep, the total area covered by the ion beam spot 202 may be approximated with a box 22, which is much larger than the wafer 204.

The traditional implantation method as illustrated in FIGS. 2A and 2B has a number of problems, especially when a low-energy (thus low-current) ion beam is used. First, such a method often assumes, as illustrated in FIG. 3, that (1) the ion beam spot 302 is relatively small compared to the target wafer 304, and (2) the ion beam spot 302 maintains the same profile 32 and delivers the same dose 34 at any location. While these assumptions may be acceptable for medium- and high-energy ion beams, they are not applicable to low-energy ion beams. As illustrated in FIG. 4, a low-energy ion beam 402 often has a spot size comparable to the target ion wafer 404, and the beam profile 42 can vary drastically resulting in a non-uniform dose 44.

Second, in the traditional method, the ion beam spot goes completely off the wafer edge in each sweep, which is known as a "full overscan." Full overscans are deemed necessary to provide a uniform ion dose even at the edges of the wafer and to allow real-time monitoring of the ion beam conditions. For example, in one known system, the ion beam spot is programmed to overscan by 1.1*W on one side and 1.5*W on the other, wherein W denotes a half-width of the ion beam spot (e.g., a distance from beam center to where beam current falls below $1/100$ of its maximum). If the spot size is small (i.e., W is small), the ion beam is off the wafer surface only briefly. However, if the spot size is large (e.g., greater than about a quarter of the wafer size), as is often the case for low-energy ion beams, the ion beam spot spends almost as much, if not more, time off the wafer as it is on the wafer. As a result, beam utilization becomes extremely low for a low-energy ion beam that is scanned fully off the wafer.

In view of the foregoing, it would be desirable to provide a solution for ion implantation which overcomes the above-described inadequacies and shortcomings.

SUMMARY OF THE DISCLOSURE

A technique for high-efficiency ion implantation is disclosed. In one particular exemplary embodiment, the technique may be realized as an apparatus for high-efficiency ion implantation. The apparatus may comprise one or more measurement devices to determine a shape of an ion beam spot in a first dimension and a second dimension. The apparatus may also comprise a control module to control movement of the ion beam across a substrate according to a two-dimensional velocity profile, wherein the two-dimensional velocity profile is determined based at least in part on the shape of the ion beam spot, and wherein the two-dimensional velocity profile is tunable to maintain a uniform ion dose and to keep the ion beam spot from going fully off the substrate surface.

In accordance with other aspects of this particular exemplary embodiment, the one or more measurement devices may be selected from a group consisting of: dose profilers; multi-pixel Faraday devices; button Faraday devices; slit Faraday devices; and Faraday sampling cups.

In accordance with further aspects of this particular exemplary embodiment, the control module may cause the ion beam spot to sweep in an opposite direction once the spot center reaches an edge of the substrate.

In accordance with additional aspects of this particular exemplary embodiment, the control module may cause the ion beam spot to move temporarily off the substrate surface and across at least one measurement device for a real-time determination of the ion dose. Further, the control module tunes the two-dimensional velocity profile based on the real-time determination of the ion dose. Alternatively, the control module adjusts the ion beam dose based on the real-time determination of the ion dose.

In accordance with a further aspect of this particular exemplary embodiment, the control module may adjust the shape of the ion beam spot based on the ion beam spot location on the substrate surface.

In another particular exemplary embodiment, the technique may be realized as a method for high-efficiency ion implantation. The method may comprise the step of measuring a shape of an ion beam spot in a first dimension and a second dimension. The method may also comprise the step of determining, based at least in part on the measured ion beam shape, a two-dimensional velocity profile for controlling movement of the ion beam spot across a substrate, wherein the two-dimensional velocity profile is tunable to maintain a uniform ion dose and to keep the ion beam spot from going fully off the substrate surface. The method may further comprise the step of moving the ion beam across the substrate according to the two-dimensional velocity profile.

In accordance with other aspects of this particular exemplary embodiment, the method may further comprise sweeping the ion beam in an opposite direction once the ion beam spot center reaches an edge of the substrate.

In accordance with further aspects of this particular exemplary embodiment, the method may further comprise positioning a dose profiler along the second dimension and sweeping the ion beam spot temporarily off the substrate surface and across the dose profiler for a real-time determination of the ion dose. The method may also comprise tuning the two-dimensional velocity profile based on the real-time determination of the ion dose. Alternatively, the method may comprise adjusting the ion beam dose based on the real-time determination of the ion dose.

In accordance with additional aspects of this particular exemplary embodiment, them method may further comprise adjusting the shape of the ion beam spot based on the ion beam spot location on the substrate surface.

In yet another particular exemplary embodiment, the technique may be realized as at least one signal embodied in at least one carrier wave for transmitting a computer program of instructions configured to be readable by at least one processor for instructing the at least one processor to execute a computer process for performing the method as recited above.

In still another particular exemplary embodiment, the technique may be realized as at least one processor readable carrier for storing a computer program of instructions configured to be readable by at least one processor for instructing the at least one processor to execute a computer process for performing the method as recited above.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 1 is a diagram illustrating a conventional ion implanter system.

DETAILED DESCRIPTION OF EXEMPLARY EMBODIMENTS

Embodiments of the present disclosure provide an ion implantation solution that improves beam utilization while maintaining a uniform ion dose. While it is applicable to all ion beam energy levels and all wafer sizes, this solution may be particularly beneficial to an ion implanter system that employs relatively low-energy ion beams. This high-efficiency ion implantation technique may also be particularly useful where an ion beam has a relatively large spot size that is comparable to the size of a target wafer (e.g., a medium-energy ion beam with a small beam spot on a small wafer). A two-dimensional (2-D) velocity profile may be used to guide an ion beam across a substrate surface, sweeping in a first dimension (e.g., X direction) while scanning in a second dimension (e.g., Y direction). Each time the ion beam traverses the substrate surface in the X direction may be referred to as a "pass." The X component of the velocity profile may be set up for a uniform ion dose along each pass, with the sweep width as a tunable parameter. The sweep width for each pass may be minimized by sweeping the ion beam spot only partially off the substrate surface. The Y component of the velocity profile may accommodate compressed and uncompressed scans as well as partial scans in both the X and Y directions. Further, the ion beam conditions may be monitored in substantial real-time, and the 2-D velocity profile may be tuned accordingly for closed-loop adjustments of the ion beam dose and/or the shape of the beam spot.

In the detailed description that follows, it should be noted that the terms "wafer" and "substrate" may refer to any workpiece that might be processed with an ion beam. Such workpieces are not limited to semiconductors or electronic materials, but may comprise any materials now known or later discovered. Further, a movement (e.g., sweeping or scanning) of an ion beam across a wafer refers to a relative movement of the ion beam with respect to the wafer. Such relative movement may be achieved, for example, by moving the ion beam while keeping the wafer stationary, or by moving the wafer while keeping the ion beam stationary, or by moving both the ion beam and the wafer simultaneously. In addition, although the following description refers to ion beam movement in the X and Y directions, it is not necessary to break down such movement in two directions, nor is it necessary that these two directions be perpendicular to each other.

Figure 2A:
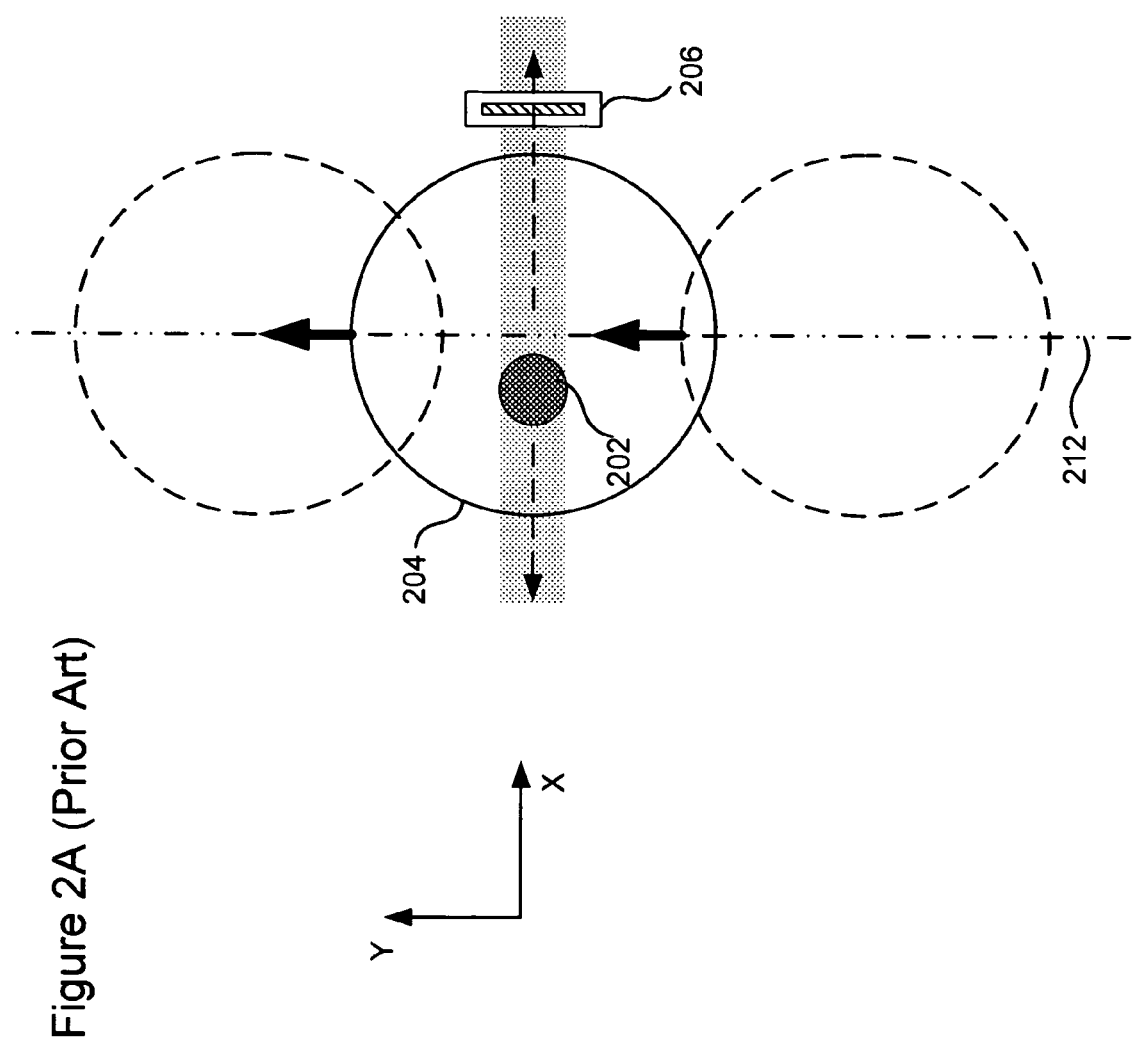
FIGS. 2A–2B illustrate a typical setup for scanning a series of wafers with an ion beam.
Figure 2B:
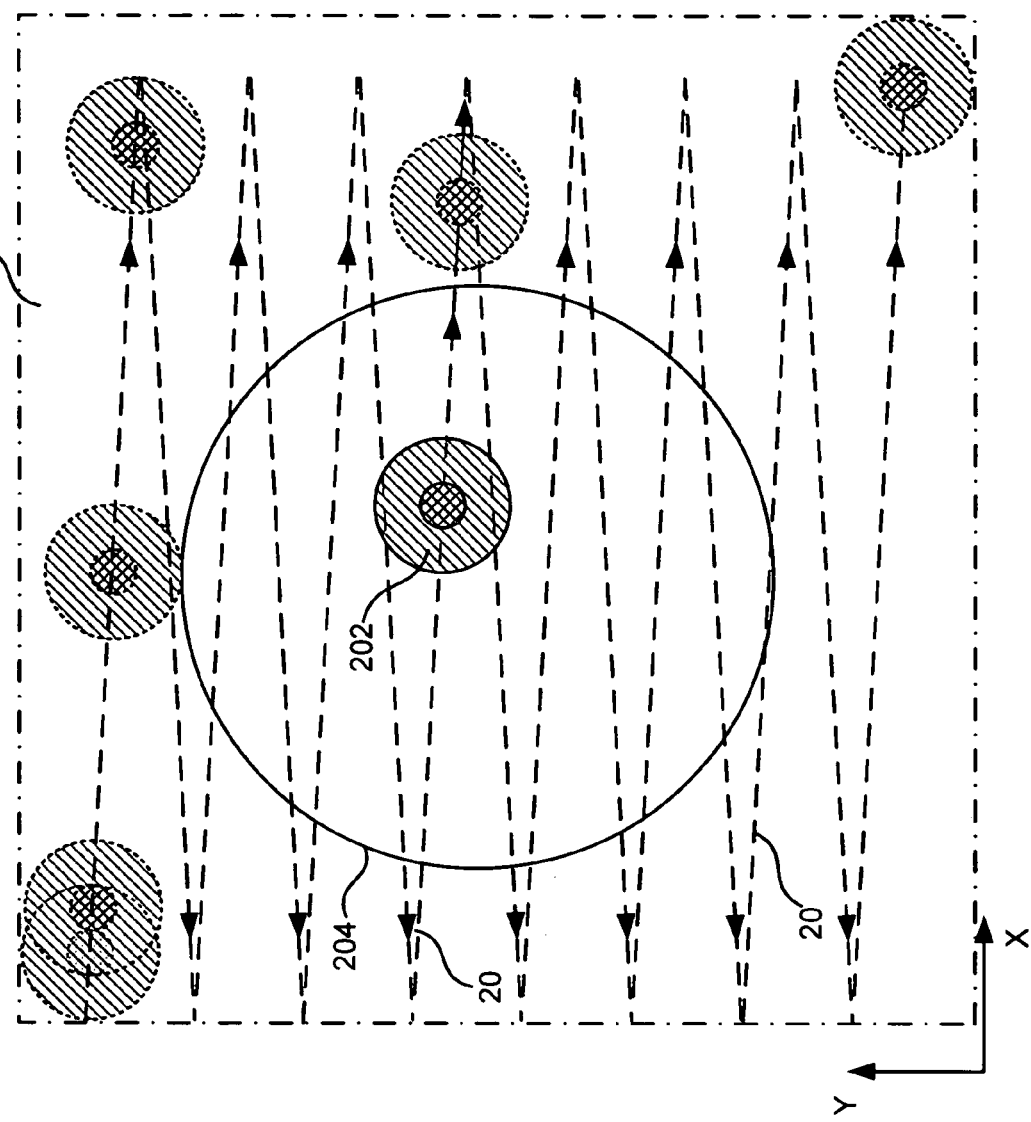
Figure 3:
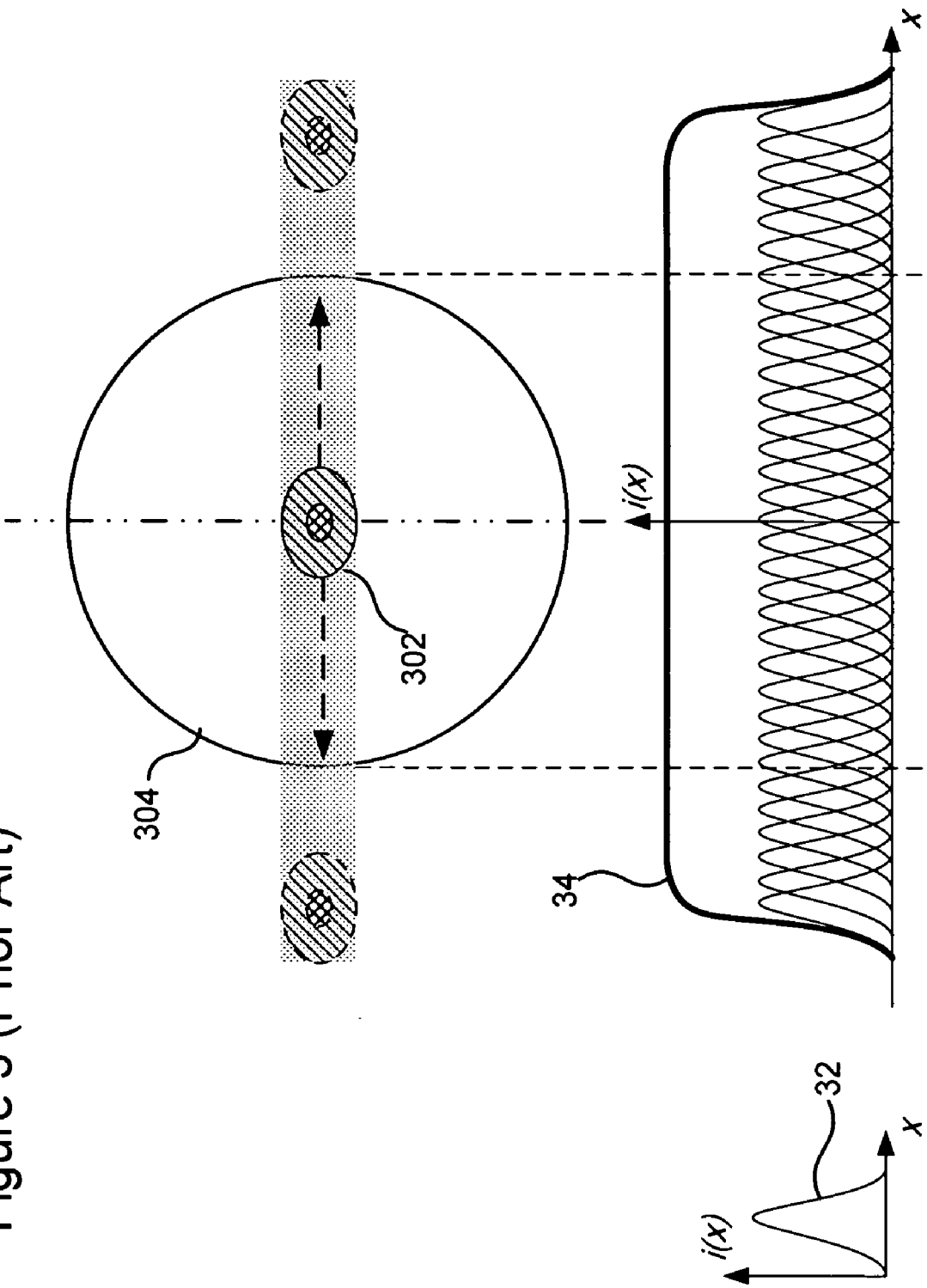
FIG. 3 illustrates some basic assumptions made in traditional ion implantation methods.
Figure 4:
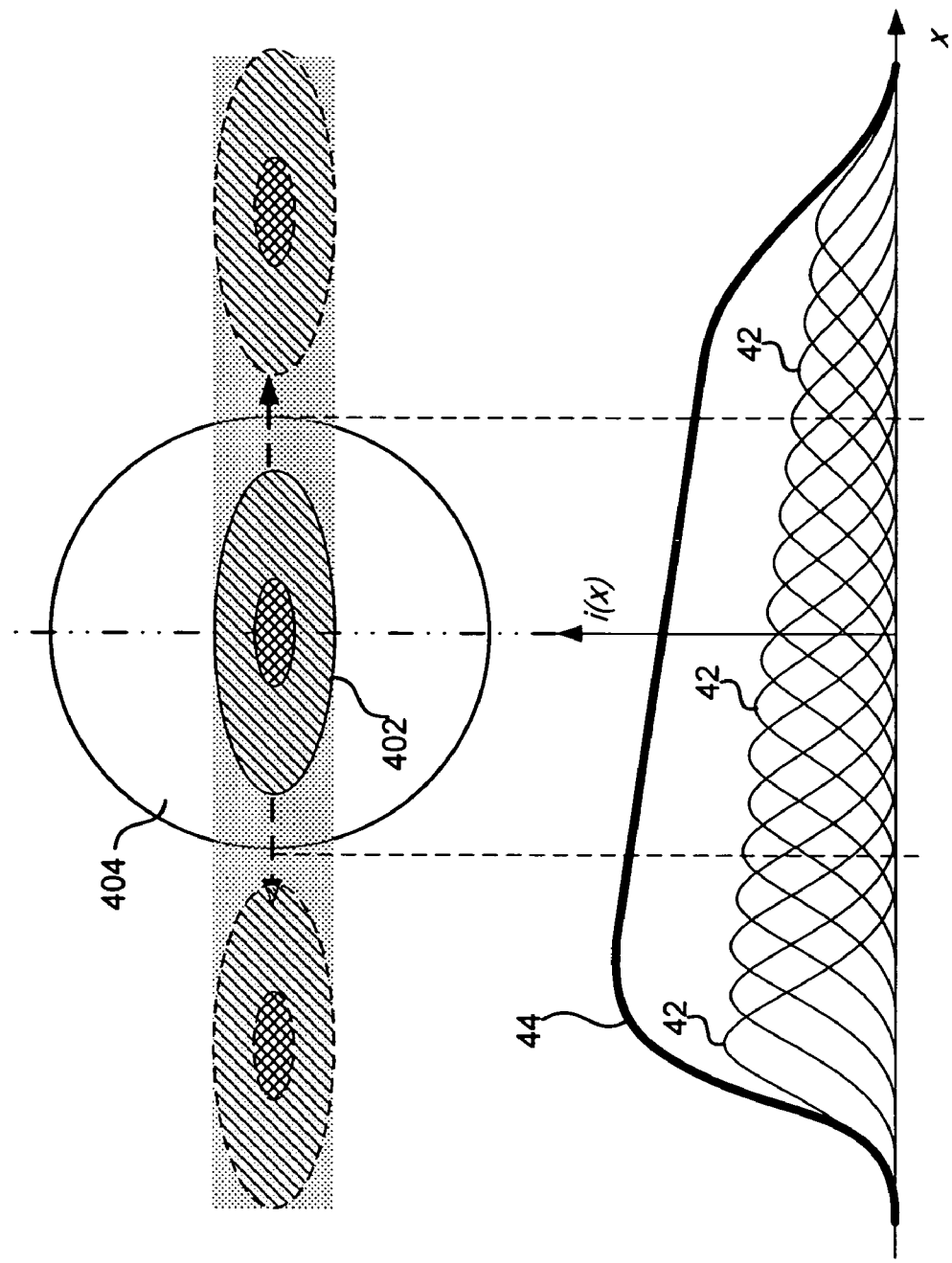
FIG. 4 illustrates a typical low-energy ion beam spot being swept across a wafer.
Figure 5:
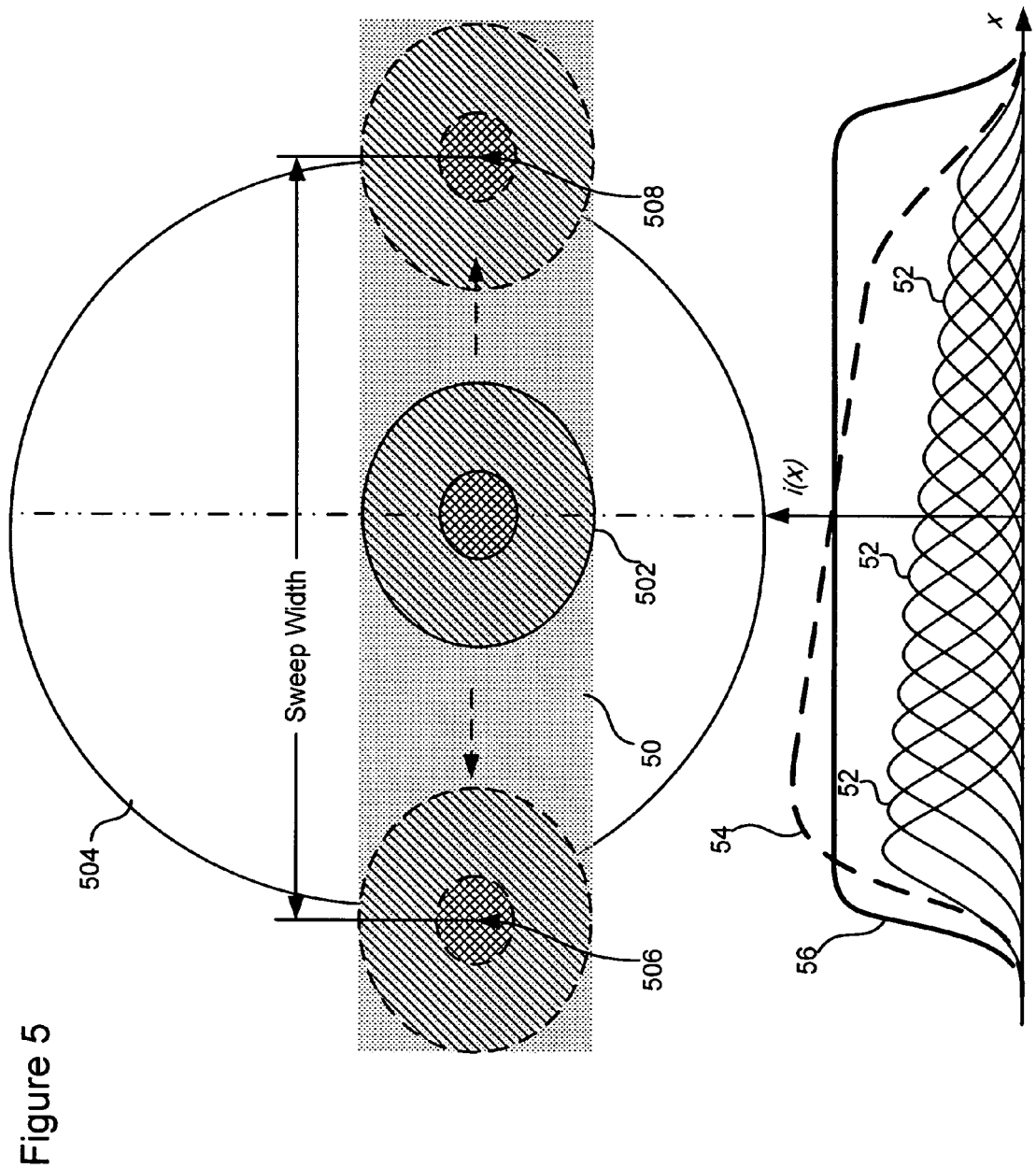
FIG. 5 illustrates an exemplary method for setting up a velocity profile for sweeping an ion beam in accordance with an embodiment of the present disclosure.

FIG. 5 illustrates an exemplary method for setting up a velocity profile for sweeping an ion beam in accordance with an embodiment of the present disclosure. An ion beam spot 502 may be swept across a substrate 504 in the X direction. The beam center may reach endpoints 506 and 508 on either end of a beam path 50. The ion beam may be a low-energy beam with a relatively large beam spot 502. As noted above, the beam profile 52 may change significantly along the beam path 50 resulting in a non-uniform dose 54. This lack of uniformity may be cured during beam setup by establishing a non-constant velocity profile that can be used to guide the ion beam in the X direction. In the velocity profile, the dwelling time of the beam spot 502 on each finite element of the beam path 50 may be fine-tuned to account for the varying beam profile 52. As a result, the velocity profile in the X direction may comprise a number of segments (known as "MicroSlopes") each corresponding to a finite element of the beam path 50 and each having its own velocity value for sweeping the ion beam in that finite element. The resulting uniform dose may be represented by waveform 56.

To increase beam utilization, it may be desirable to keep the ion beam spot 502 from going fully off the substrate 504. That is, the ion beam may be turned around and swept in an opposite direction once the ion beam spot 502 is about to move off the substrate 504. According to some embodiments, the beam center may move beyond the edge by a distance $\Delta X$, wherein $0<\Delta X<0.5*W$. W denotes a half width of the ion beam spot 502. In an exemplary embodiment, the center of a symmetrical ion beam spot may dwell at an edge of the substrate 504 for approximately twice the time it spends at the center of the substrate 504.

The shape of the ion beam spot 502, such as its width (in X direction) and height (in Y direction), may be determined in a variety of ways as described below. The spot shape may be represented in the form of a 2-D beam current density distribution. Total distance that the ion beam spot 502 travels from one end of the beam path 50 to the other, that is, between the endpoints 506 and 508, may be referred to as a "sweep width." With a partial scan of the ion beam spot 502, it may be desirable to increase the dwelling time of the ion beam near the edge of the substrate 504 in order to compensate for a roll-off of ion dose. Typically, any change in the sweep width may lead to an adjustment to the velocity profile in the X direction. Therefore, the sweep width may be a tunable parameter in the velocity profile for the X direction. According to one embodiment, in order to maximize beam utilization, the sweep width may be minimized by making $\Delta X$ zero, that is, turning the ion beam around as soon as it hits the substrate edge.

Figure 6:
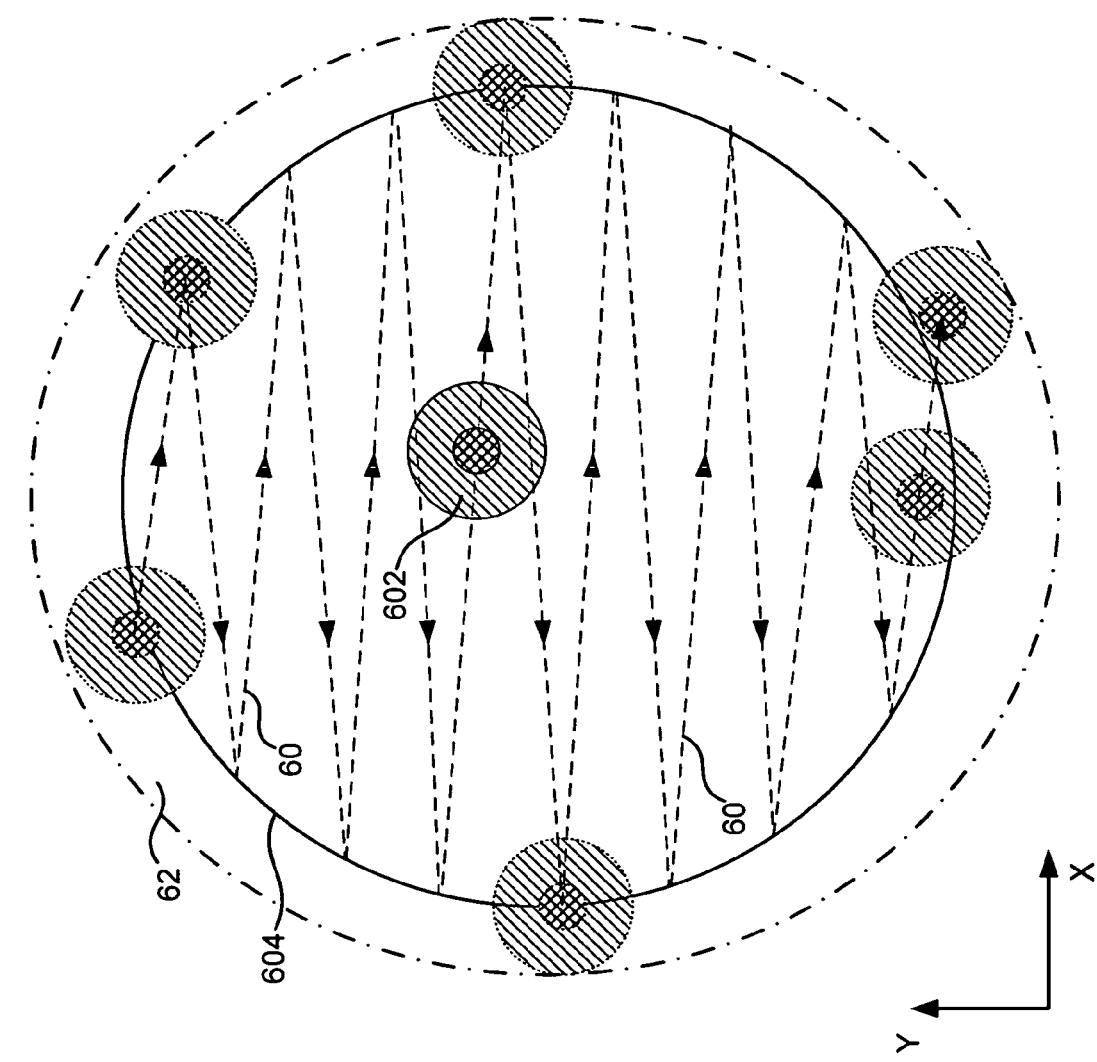
FIG. 6 illustrates an exemplary method for guiding an ion beam according to a 2-D velocity profile in accordance with an embodiment of the present disclosure.

FIG. 6 illustrates an exemplary method for guiding an ion beam according to a 2-D velocity profile in accordance with an embodiment of the present disclosure. FIG. 6 shows a beam path 60 of an ion beam spot 602 as it is guided across a substrate 604 according to the 2-D velocity profile. The 2-D velocity profile may comprise an X component as established according to the exemplary method illustrated in FIG. 5. As shown, a partial scan of the ion beam spot 602 in the X direction is effectuated in each pass. The 2-D velocity profile may also comprise a Y component that guides the scanning of the ion beam spot 602 in the Y direction. The Y component of the velocity profile may be set up to accommodate a varying sweep width for each pass. In the Y direction, the ion beam spot 602 may also be scanned partially off the substrate 604. According to some embodiments, the Y-direction overscan $\Delta Y$ may be in a range of $0<\Delta Y<0.5*H$, wherein H denotes a half height of the ion beam spot 602. With partial scans in both the X and Y directions, the ion implantation may be limited to an area 62 that is only slightly larger than the substrate 604.

Figure 7:
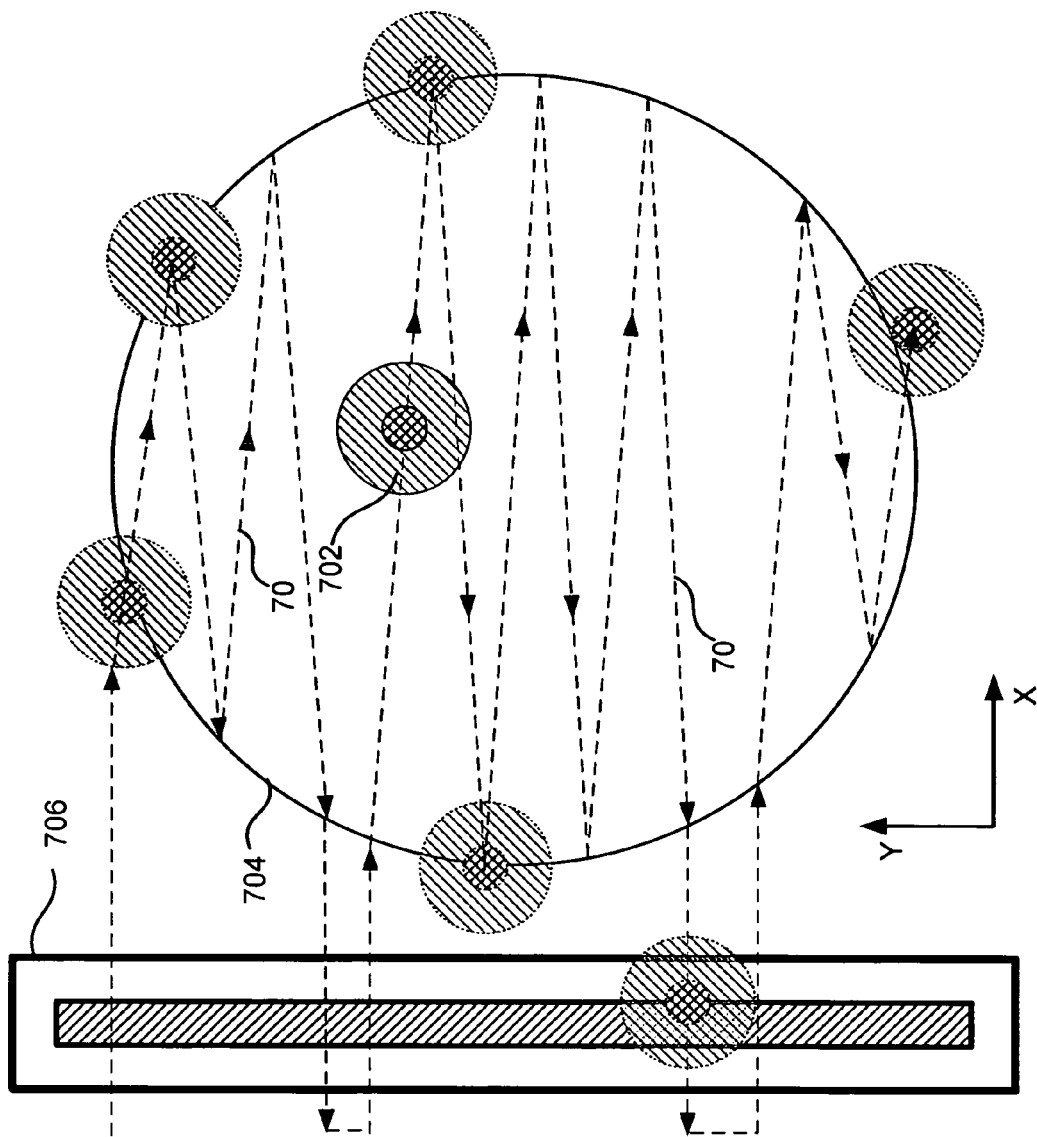
FIG. 7 illustrates another exemplary method for guiding an ion beam according to a 2-D velocity profile in accordance with an embodiment of the present disclosure.

FIG. 7 illustrates another exemplary method for guiding an ion beam according to a 2-D velocity profile in accordance with an embodiment of the present disclosure. In this configuration, a dose profiler 706 may be placed along a side of a substrate 704. An ion beam spot 702 may be moved along a beam path 70 according to a 2-D velocity profile. The 2-D velocity profile may cause the ion beam spot 702 to temporarily sweep off the substrate 704 and across the dose profiler 706 for a real-time measurement of ion dose. If the ion dose is found to be out of an acceptable range, the scanning and/or sweeping of the ion beam spot 702 may be slowed down for the ion beam dose to be adjusted. Alternatively, the 2-D velocity profile may be tuned in real-time to compensate for the change in the ion dose. In addition, the dose profiler 706 and/or other measurement devices may be used to detect changes, if any, in the shape of the ion beam spot 702. And the 2-D velocity profile may be adjusted to compensate for the detect change of beam shape.

Figure 8B:
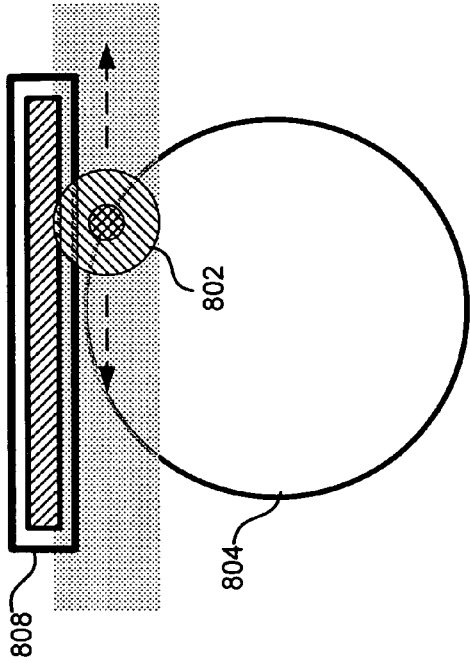
FIGS. 8A–8C illustrate exemplary setups for ion beam measurement devices in accordance with an embodiment of the present disclosure.
Figure 8A:
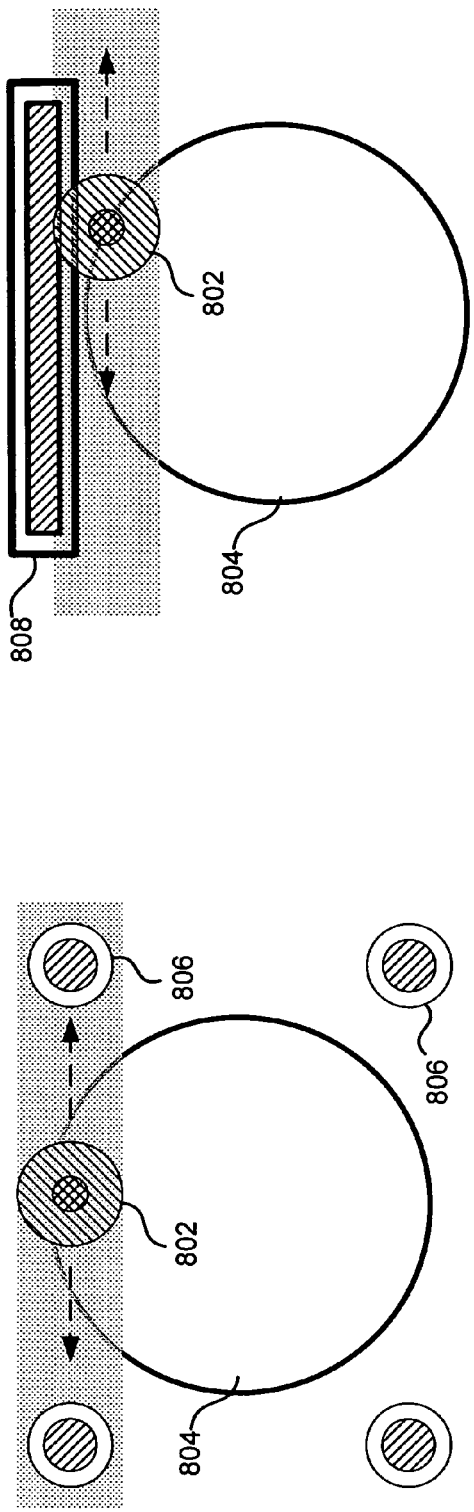
Figure 8C:
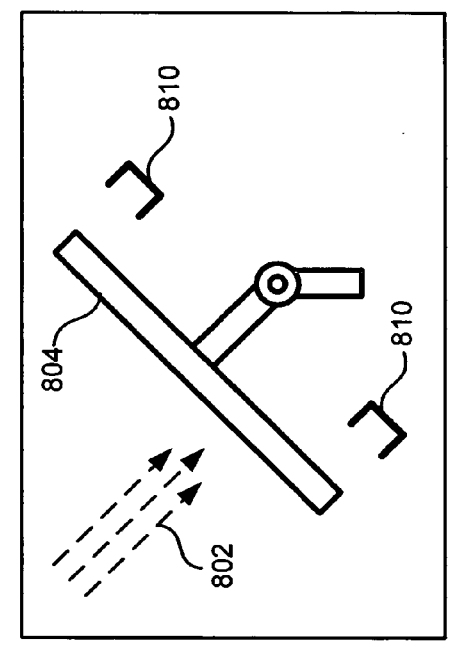

FIGS. 8A–8C illustrate exemplary setups for ion beam measurement devices in accordance with an embodiment of the present disclosure. Various measurement devices may be configured in a number of ways to detect ion beam current or dose and to determine the shape of an ion beam spot. For example, as shown in FIG. 8A, one or more button Faraday devices 806 may be placed in the corners of a platen 804. The button Faraday devices 806 are preferably located in the same plane as the platen 804. An ion beam spot 802 may be caused to move across a button Faraday device 806 for measurement. FIG. 8B shows a dose profiler 808 being placed horizontally next to the platen 804. The orientation of the dose profiler 808 may enable it to detect the height (or a change in height) of the ion beam spot 804 in order to facilitate a vertical partial scan. FIG. 8C shows a side view of the platen 804 which may be rotated or tilted. One or more sampling cups 810 may be placed behind the wafer plane of the platen 804 to calibrate the ion beam 802, for example, between the processing of wafers.

The measurement methods illustrated in FIGS. 8A–8C may be implemented during beam setup or in real-time during an ion implantation process or both. For example, during beam setup, a dummy wafer may be placed on the platen 804, and the measurement devices may be used to provide feedback in establishing a 2-D velocity profile for beam movement. During an ion implantation process, the ion beam 802 may be briefly moved off a wafer and over one or more of the measurement devices for real-time monitoring of the beam conditions.

Figure 9:
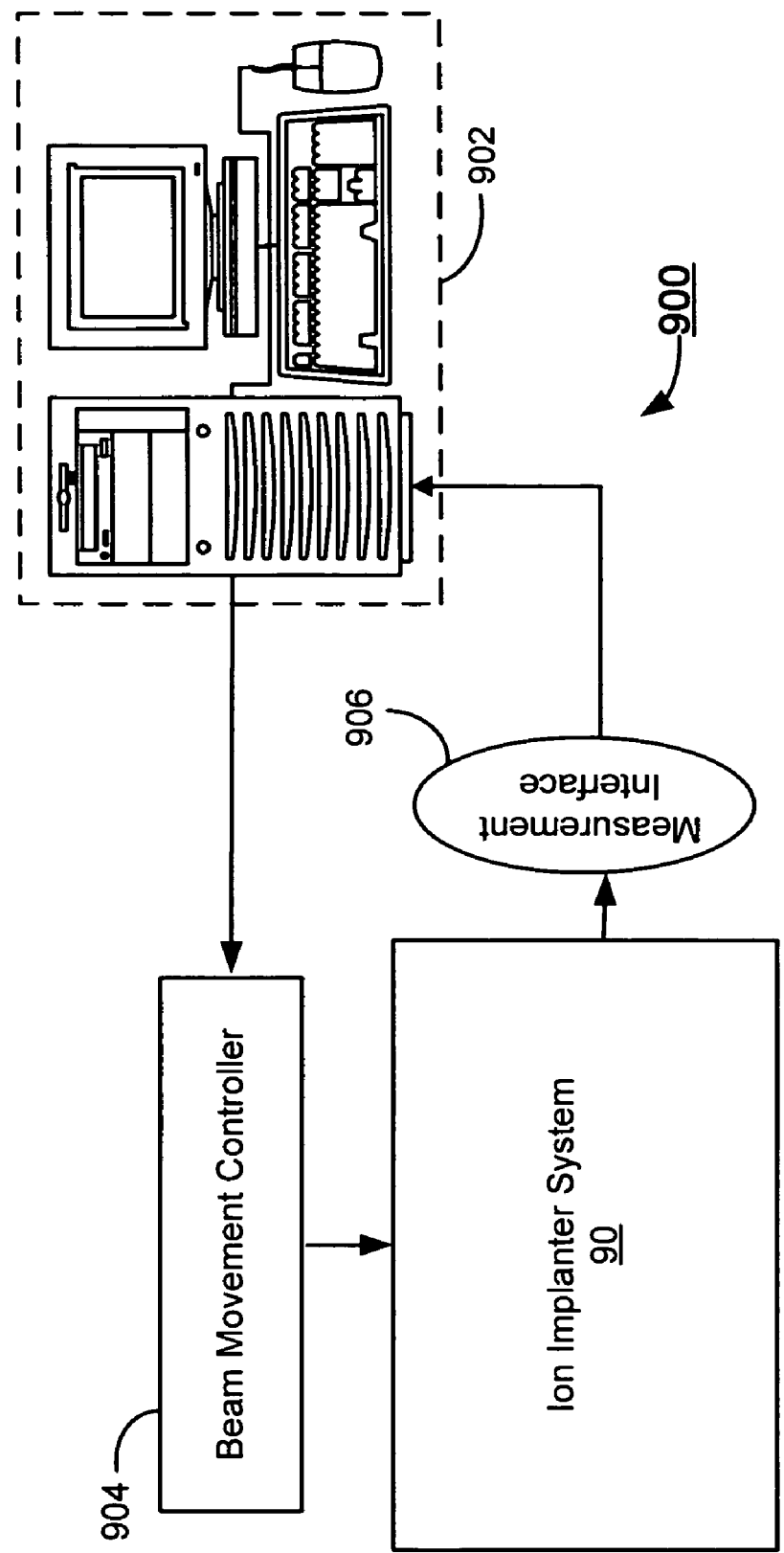
FIG. 9 illustrates an exemplary system for high-efficiency ion implantation in accordance with an embodiment of the present disclosure.

FIG. 9 illustrates an exemplary system for high-efficiency ion implantation in accordance with an embodiment of the present disclosure. The system 900 may comprise a processor unit 902 (e.g., a dose controller) which may be a microprocessor, micro-controller, personal computer (PC), or any other processing device. The system 900 may also comprise a beam movement controller 904 that controls the movement of an ion beam in an ion implanter system 90 according to instructions received from the processor unit 902. The system 900 may further comprise a measurement interface 906 through which the processor unit 902 may receive ion beam measurement data (e.g., beam current, dose and shape) from the ion implanter system 90. The measurement interface 906 may include or be coupled to one or more measurement devices. The system 900 may be used to set up a 2-D velocity profile for beam movement, to control an ion implantation process based on the 2-D velocity profile, and to provide real-time, closed-loop adjustments to the 2-D velocity profile.

Figure 10:
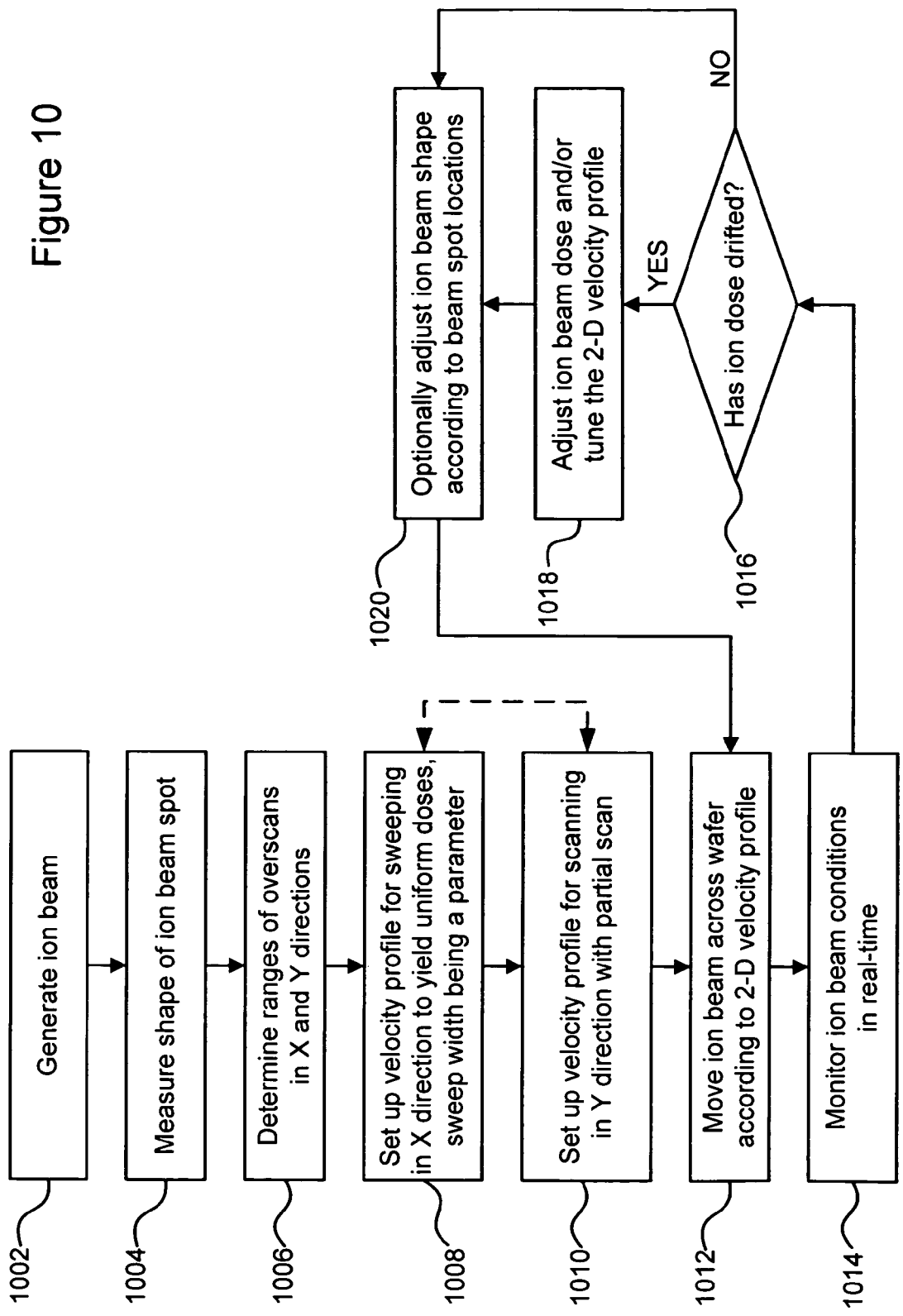
FIG. 10 is a flow chart illustrating an exemplary method for high-efficiency ion implantation in accordance with an embodiment of the present disclosure.

FIG. 10 is a flow chart illustrating an exemplary method for high-efficiency ion implantation in accordance with an embodiment of the present disclosure.

In step 1002, an ion beam may be generated in an ion implanter system. The ion beam may be a low-energy beam having a large spot size comparable to a target wafer.

In step 1004, the shape of the ion beam spot, such as its width and height, may be determined. The shape may be derived, for example, from a measurement of the ion beam's 2-D current density distribution in a wafer plane. The shape of the ion beam spot may be used in step 1006 as a basis to determine ranges of overscans in the X and Y directions.

In step 1008, a first velocity profile may be established for sweeping the ion beam in the X direction, wherein MicroSlopes may be fine-tuned to yield uniform ion doses and the sweep width in each pass may be a tunable parameter of the velocity profile. In step 1010, a second velocity profile may be established for scanning the ion beam in the Y direction, preferably with partial scans. The first and second velocity profiles may together provide a 2-D velocity profile for beam movement. Since the beam movement in the X and Y directions are coordinated, the method steps 1008 and 1010 may be iterated to produce a desired 2-D velocity profile. For example, for different passes, the sweep width may be adjusted for partial scans in the X direction. The change in the sweep width may change the velocity profiles in both the X and Y directions. Accordingly, iterative adjustments may be made to the X component and the Y component of the 2-D velocity profile.

In step 1012, the ion beam may be moved across the wafer surface according to the predetermined 2-D velocity profile. Meanwhile, in step 1014, the ion beam conditions may be monitored in real-time.

In step 1016, it may be determined whether the ion dose has drifted off from its tolerated range. If so, the ion beam dose may be adjusted in step 1018. Alternatively, the 2-D velocity profile may be tuned to account for the changes in the ion beam conditions.

In step 1020, the ion beam shape may be optionally adjusted according to the beam spot locations. For example, it may be desirable to have an ion beam spot that is relatively smaller near an edge of the wafer than in the center of the wafer. Therefore, it may be beneficial to tune one or more beam-line elements to narrow the ion beam spot when it approaches the wafer edge. As a result, the 2-D velocity profile may be tuned in real-time for the change in the shape of the ion beam spot.

At this point it should be noted that the technique for high-efficiency ion implantation in accordance with the present disclosure as described above typically involves the processing of input data and the generation of output data to some extent. This input data processing and output data generation may be implemented in hardware or software. For example, specific electronic components may be employed in an ion implanter system or similar or related circuitry for implementing the functions associated with high-efficiency ion implantation in accordance with the present disclosure as described above. Alternatively, one or more processors operating in accordance with stored instructions may implement the functions associated with high-efficiency ion implantation in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for high-efficiency ion implantation, the apparatus comprising:
   one or more measurement devices to determine a shape of an ion beam spot in a first dimension and a second dimension; and
   a control module to control movement of the ion beam across a substrate according to a two-dimensional velocity profile, wherein the two-dimensional velocity profile is determined based at least in part on the shape of the ion beam spot, and wherein the two-dimensional velocity profile is tunable to maintain a uniform ion dose and to keep the ion beam spot from going fully off the substrate surface.

2. The apparatus according to claim 1, wherein the one or more measurement devices are selected from a group consisting of:
   dose profilers;
   multi-pixel Faraday devices;
   button Faraday devices;
   slit Faraday devices; and
   Faraday sampling cups.

3. The apparatus according to claim 1, wherein the control module causes the ion beam spot to sweep in an opposite direction once the spot center reaches an edge of the substrate.

4. The apparatus according to claim 1, wherein the control module causes the ion beam spot to move temporarily off the substrate surface and across at least one measurement device for a real-time determination of the ion dose.

5. The apparatus according to claim 4, wherein the control module tunes the two-dimensional velocity profile based on the real-time determination of the ion dose.

6. The apparatus according to claim 4, wherein the control module adjusts the ion beam dose based on the real-time determination of the ion dose.

7. The apparatus according to claim 1, wherein the control module adjusts the shape of the ion beam spot based on the ion beam spot location on the substrate surface.

8. A method for high-efficiency ion implantation, the method comprising the steps of:
- measuring a shape of an ion beam spot in a first dimension and a second dimension;
- determining, based at least in part on the measured ion beam shape, a two-dimensional velocity profile for controlling movement of the ion beam spot across a substrate, wherein the two-dimensional velocity profile is tunable to maintain a uniform ion dose and to keep the ion beam spot from going fully off the substrate surface; and
- moving the ion beam across the substrate according to the two-dimensional velocity profile.

9. The method according to claim 8 further comprising:
- sweeping the ion beam in an opposite direction once the ion beam spot center reaches an edge of the substrate.

10. The method according to claim 8 further comprising:
- positioning a dose profiler along the second dimension; and
- sweeping the ion beam spot temporarily off the substrate surface and across the dose profiler for a real-time determination of the ion dose.

11. The method according to claim 10 further comprising:
- tuning the two-dimensional velocity profile based on the real-time determination of the ion dose.

12. The method according to claim 10 further comprising:
- adjusting the ion beam dose based on the real-time determination of the ion dose.

13. The method according to claim 8 further comprising:
- adjusting the shape of the ion beam spot based on the ion beam spot location on the substrate surface.

14. At least one signal embodied in at least one carrier wave for transmitting a computer program of instructions configured to be readable by at least one processor for instructing the at least one processor to execute a computer process for performing the method as recited in claim 8.

15. At least one processor readable carrier for storing a computer program of instructions configured to be readable by at least one processor for instructing the at least one processor to execute a computer process for performing the method as recited in claim 8.

* * * * *